United States Patent [19]
Kim

[11] Patent Number: 6,051,370
[45] Date of Patent: *Apr. 18, 2000

[54] RADIATION-SENSITIVE MIXTURE

[75] Inventor: Son Nguyen Kim, Hemsbach, Germany

[73] Assignee: BASF Aktiengesellschaft, Ludwigshafen, Germany

[ * ] Notice: This patent is subject to a terminal disclaimer.

[21] Appl. No.: 08/370,547

[22] Filed: Jan. 9, 1995

Related U.S. Application Data

[63] Continuation of application No. 08/026,162, Mar. 1, 1993, abandoned, which is a continuation of application No. 07/665,869, Mar. 7, 1991, abandoned.

[30] Foreign Application Priority Data

Mar. 13, 1990 [DE] Germany .............................. 40 07 924

[51] Int. Cl.[7] .............................. G03F 7/30; G03F 7/004
[52] U.S. Cl. ........................ 430/326; 430/270.1; 430/330; 430/905; 522/31
[58] Field of Search ...................... 430/326, 330, 430/909, 914, 920, 270, 905, 921, 296, 942, 966, 967, 270.1; 522/31, 154

[56] References Cited

U.S. PATENT DOCUMENTS

| | | | |
|---|---|---|---|
| 3,779,778 | 12/1973 | Smith et al. ............................. | 430/270 |
| 3,915,706 | 10/1975 | Limburg et al. ......................... | 430/270 |
| 4,101,323 | 7/1978 | Buhr et al. ............................... | 96/35 |
| 4,491,628 | 1/1985 | Ito et al. ............................. | 430/270 X |
| 4,678,737 | 7/1987 | Schneller et al. ....................... | 430/270 |
| 4,684,671 | 8/1987 | Tsuchiya et al. ......................... | 522/31 |
| 4,689,288 | 8/1987 | Buiguez et al. ......................... | 430/270 |
| 4,770,977 | 9/1988 | Buiguez et al. ..................... | 430/270 X |
| 4,883,740 | 11/1989 | Schwalm et al. ....................... | 430/270 |
| 5,034,305 | 7/1991 | Nguyen-Kim et al. .................. | 430/270 |
| 5,035,979 | 7/1991 | Nguyen-Kim et al. ............. | 430/270.1 |
| 5,069,997 | 12/1991 | Schwalm et al. ....................... | 430/270 |

FOREIGN PATENT DOCUMENTS

| | | | |
|---|---|---|---|
| 0 302 359 | 7/1988 | European Pat. Off. . | |
| 0342498 | 11/1989 | European Pat. Off. ............... | 430/270 |
| 2-062544 | 3/1990 | Japan ..................... | 430/942 |
| 2-161436 | 6/1990 | Japan ..................... | 430/270 |
| 2-48952 | 10/1990 | Japan ..................... | 430/270 |

OTHER PUBLICATIONS

Patent & Trademark English–Language Translation of Japanese Patent 2–62544 (pub. Mar. 2, 1990).
Patent & Trademark Office English–Language Translation of Japanese Patent 2–248952 (Pub. Oct. 4, 1990).
Patent Abstracts of Japan, vol. 12, No. 339 p. 757, Sep. 12, 1988 citing JP–63–97947.
Hayashi et al, Chem Abs. Photoresist, Issue 1, 1990 244016m.
PME, 1989, Polymers for Microelectronics—Science and Technology, p. 66–67.
Journal of Polymer Science, Part A, vol. 24, 2971–2980.
Crivello, Org. Coatings and Appl, Polym. Sci., 48 (1985), 65–69.

*Primary Examiner*—Janis L. Dote
*Attorney, Agent, or Firm*—Keil & Weinkauf

[57] ABSTRACT

A radiation-sensitive mixture suitable for producing relief structures consists essentially of (a) a water-insoluble but alkali-soluble binder or binder mixture and (b) a compound which forms a strong acid on irradiation, wherein component (a) is a phenolic resin whose phenolic hydroxyl groups have been replaced to a certain extent by groups (I)

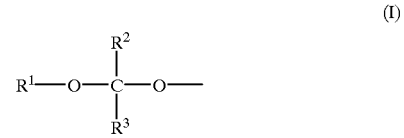

(I)

where $R^1$ is alkyl, and $R^2$ and $R^3$ are each hydrogen or alkyl, or $R^1$ forms a ring with $R^2$.

19 Claims, No Drawings

RADIATION-SENSITIVE MIXTURE

This application is a continuation of application Ser. No. 08/026,162, filed on Mar. 1, 1993, now abandoned, which is a continuation of application Ser. No. 07/665,869, filed on Mar. 7, 1991, now abandoned.

The present invention relates to positive-working radiation-sensitive mixtures which contain a water-insoluble but alkali-soluble binder and a compound which on irradiation forms an acid, wherein the binder contains certain groups which are hydrolyzed by acid catalysis and increase the alkali solubility of the mixture. These mixtures are sensitive to UV, electron beams and X-rays and are suitable in particular for use as resist materials.

Positive-working radiation-sensitive mixtures are known; in particular positive-working resist materials which contain o-quinonediazides in alkali-soluble binders, eg. novolaks or poly(p-vinylphenol)s, are used commercially. However, the sensitivity of these systems to radiation, in particular short-wave radiation, is in some instances unsatisfactory.

Sensitivity increases in radiation-sensitive systems which in the primary photoreaction create a species which then initiates the catalytic secondary reaction independently of the radiation have been described. For instance, U.S. Pat. No. 3,915,706 describes for example photoinitiators which produce a strong acid which then, in a secondary reaction, cleaves acid-labile groups, such as polyaldehyde groups.

The prior art further discloses radiation-sensitive mixtures based on acid-cleavable compounds containing an alkali-soluble polymer as binder together with a compound which photochemically forms a strong acid and a further compound having acid-cleavable bonds which, through the action of the acid, increase the solubility of the mixtures in an alkaline developer (cf. DE-A-3,406,927). The compounds mentioned as forming a strong acid by photochemical means are diazonium, phosphonium, sulfonium and iodonium compounds and also halogen compounds. The use of these onium salts as photochemical acid donors in resist materials is also known for example from U.S. Pat. No. 4,491,628. The use of onium salts in resist materials is reviewed by Crivello in Org. Coatings and Appl. Polym. Sci., 48 (1985), 65–69.

Radiation-sensitive mixtures of polymers having acid-labile side groups and photochemical acid donors are known for example from U.S. Pat. No. 4,491,628 and FR-A-2,570,844. However, these polymeric binders are hydrophobic and only become alkali-soluble on irradiation.

Copolymers having phenolic and acid-labile groups, such as, say, poly(p-hydroxystyrene-co-t-butoxy-carbonyloxystyrene), are known from J. Polym. Sci., Part A, Polym. Chem. Ed. 24 (1986), 2971–2980. However, if those copolymers of this group which are still alkali-soluble are used with commercial sulfonium salts, such as triphenylsulfonium hexafluoroarsenate, as also described in U.S. Pat. No. 4,491,628, these mixtures have the disadvantage of very high depletion in the nonirradiated areas, since the sulfonium salts mentioned do not contribute sufficiently to solubility inhibition.

DE-A-3,721,741 describes radiation-sensitive mixtures which contain an alkali-soluble polymeric binder and also an organic compound whose solubility in aqueous alkali is increased by the action of an acid and which contains at least one acid-cleavable group, and this organic compound forms a strong acid on irradiation.

DE-C-2,306,248 discloses a photosolubilizable composition of matter and a light-sensitive recording material which contains a phenolic binder, a photoactive acid donor (halogen-containing s-triazine derivative or diazonium salt) and a reaction product of an organic compound which contains at least one alkyl vinyl ether group and a monohydric or polyhydric phenol, ie. a three-component system. However, these systems lack thermal stability and have structure properties which make them unsuitable for use in the submicron region.

CA Selects: Photoresist, Issue 1, 1990, 244016m, discloses a polyhydroxystyrene whose hydroxyl groups are protected by tetrahydropyranyl and tetrahydrofuranyl groups and which is combined with bis(tert.-butylphenyl)-iodonium triflate. Similarly, PME 1989 (=Polymers for Microelectronics—Science and Technology), pages 66–67, discloses a polyhydroxystyrene whose OH groups have been partly replaced by tetrahydropyranyl groups, combined with triphenylsulfonium triflate. The disadvantage of the last two systems is that on overexposure they are no longer positive-working but become negative-working, which greatly limits their utility.

U.S. Pat. No. 4,101,323 describes radiation-sensitive copy materials which contain binders with acid-cleavable —C—O—C— groups in the main chain and also a polychlorine compound as acid donor. EP-A-302,359 describes radiation-sensitive copying materials containing a three-component system comprising an alkali-soluble phenolic binder, a polychlorine compound as acid donor and a compound having two acetal groups as inhibitor. Whereas the copy materials described in the abovementioned US Patent are very difficult to manufacture reproducibly, the copy materials described in the cited European Patent Application have the abovementioned disadvantages of three-component systems.

It is an object of the present invention to provide a novel positive-working highly active radiation-sensitive system for producing relief structures which is developable with aqueous alkali and makes it possible to prepare layers which are sensitive to shortwave UV. This is to be achieved with a radiation-sensitive mixture which contains a water-insoluble but alkali-soluble binder with an acid-hydrolyzable group and a compound which on irradiation forms a strong acid through imagewise exposure, heating and washout of the irradiated areas with a developer.

We have found, surprisingly, that the object is achieved by replacing from 20 to 70% of the phenolic hydroxyl groups of the binder for certain acetal groups to obtain a highly active radiation-sensitive system for the production of relief structures in shortwave UV which are particularly notable for very good reproducibility and high resolution.

The present invention accordingly provides a radiation-sensitive mixture consisting essentially of (a) a water-insoluble but alkali-soluble binder or binder mixture and (b) a compound which forms a strong acid on irradiation, wherein component (a) is a phenolic resin whose phenolic hydroxyl groups have been replaced to an extent of from 20 to 70% by groups (I)

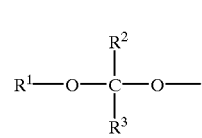

where $R^1$ is alkyl, $R^2$ is alkyl and $R^3$ is hydrogen or alkyl, or $R^1$ together with $R^2$ forms a ring via $-(CH_2)_m-$, where m is from 3 to 6.

Component (a) can be a poly(p-hydroxystyrene) or poly(p-hydroxy-α-methylstyrene) having an average molecular weight $M_w$ of from 200 to 200,000 in which from 20 to 70%, preferably from 25 to 60%, of the phenolic hydroxyl groups have been replaced by group (I).

Preferred binder components (a) are those which contain groups (II) and (III) or (II) and (IV)

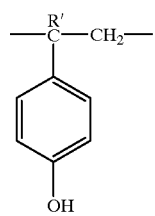
(II)

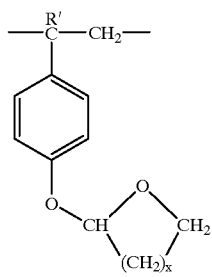
(III)

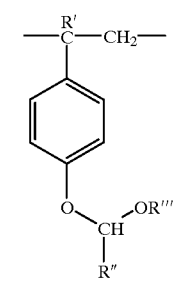
(IV)

where x is 2 or 3,

R' is hydrogen or methyl, and

R" and R''' are identical to or different from each other and each is alkyl of from 1 to 4 carbon atoms, such as the copolymers of p-hydroxystyrene and 2-tetrahydropyranyloxystyrene or 2-tetrahydrofuranyloxystyrene, which copolymers have also been prepared by polymer-analogous reaction.

Component (b) of the radiation-sensitive mixtures according to the present invention is preferably a sulfonium or iodonium salt of the formula (V) or (VI)

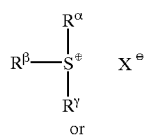
(V)

or

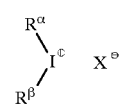
(VI)

where $R^\alpha$, $R^\beta$ and $R^\gamma$ are identical to or different from one another and each is alkyl of from 1 to 3 carbon atoms, aryl, substituted aryl or aralkyl and $X^\ominus$ is $ClO_4^\ominus$, $AsF_6^\ominus$, $SbF_6^\ominus$, $PF_6^\ominus$, $BF_4^\ominus$, $CH_3SO_3^\ominus$ or $CF_3SO_3^\ominus$, in particular those in which at least one of $R^\alpha$, $R^\beta$ and $R^\gamma$ is a radical of the formula (VII)

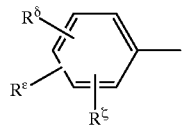
(VII)

where $R^\delta$, $R^\epsilon$ and $R^\zeta$ are identical to or different from one another and each is hydrogen, hydroxyl, halogen, or alkyl, acyloxy or alkoxy each of from 1 to 4 carbon atoms.

The radiation-sensitive mixtures according to the present invention generally contain component (a) in an amount of from 80 to 99% by weight and component (b) in an amount of from 1 to 20% by weight.

The mixtures according to the present invention may additionally contain sensitizers which absorb radiation and transfer it to component (b) and/or additionally up to 1% by weight of an adhesion promoter, surfactant or dye.

The present invention also provides a process for preparing light-sensitive coating materials using radiation-sensitive mixtures according to the present invention and also a process for producing relief structures by application of the radiation-sensitive mixture in a thickness of from 0.1 to 5 µm to a conventionally pre-treated substrate, for example a surface oxidized and optionally hexamethyldisilazane treated silicon wafer, drying at 70–130° C., imagewise exposure, optional heating to 70–160° C. and development in aqueous alkali, which comprises using a radiation-sensitive mixture according to the present invention.

The system according to the present invention is particularly advantageous since it can be used in combination with the particularly inexpensive novolak-based binders. The relief structures obtained therewith are notable for very good reproducibility and high resolution.

There now follow specific observations concerning the formative components of the radiation-sensitive mixture according to the present invention.

a) Because of the plasma etch stability which is usually required, the water-insoluble but alkali-soluble binder or binder mixture can be a phenolic resin whose phenolic hydroxyl groups have been replaced to an extent of from 20 to 70%, in particular from 25 to 60%, for the group (I), such as a corresponding novolak having a molecular weight $M_w$ of from 300 to 20,000, preferably of from 300 to 2,000, g/mol, or in particular, for exposure to shortwave UV ($\leq 300$ nm), a novolak based on p-cresol/formaldehyde, a poly-p-hydroxystyrene or a poly-p-hydroxy-α-methylstyrene, in which case the poly-p-hydroxystyrene has in general a molecular weight $M_w$ of from 200 to 200,000, preferably of from 1000 to 40,000, g/mol. According to the present invention, this poly-p-hydroxystyrene can also be modified in a conventional manner by reaction (a polymer-analogous reaction) of its hydroxyl groups with, for example, 3,4-dihydropyran or dihydrofuran. The modified polymeric binder (a) thus obtainable, which in the present case must also be considered a copolymer, preferably consists essentially of groups (II) and (III) or (II) and (IV)

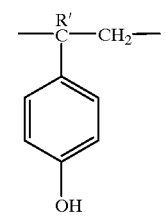

(II)

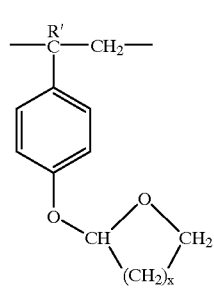

(III)

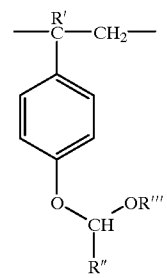

(IV)

where x is 2 or 3,

R' is hydrogen or methyl, and

R" and R'" are identical to or different from each other and each is alkyl of from 1 to 4 carbon atoms, ie. a copolymer of p-hydroxystyrene and 2-tetrahydropyranyloxystyrene or 2-tetrahydrofuranyloxystyrene, which copolymer may also be prepared by polymer-analogous reaction.

It is also possible to use mixtures of the abovementioned binders (a). Binder (a) is in general present in the mixture according to the present invention in an amount of from 80 to 99, preferably 90 to 97, % by weight, based on the total amount of the radiation-sensitive mixture (a)+(b).

b) The compound (b) which forms a strong acid on irradiation can in principle be any compound which has this property and thus acts as an acid donor. However, for irradiation with shortwave UV it is preferable to use iodonium and in particular sulfonium salts. These conform respectively to the formulae (V) and (VI)

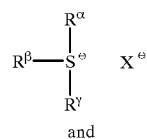

(V)

and

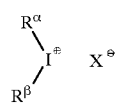

(VI)

where $R^\alpha$, $R^\beta$ and $R^\gamma$ are identical to or different from one another and each is alkyl, for example of from 1 to 3 carbon atoms, preferably methyl or ethyl, aryl, eg. phenyl or aralkyl, eg. benzyl, or the radical

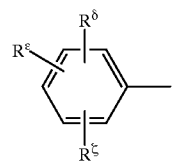

where $R^\delta$, $R^\epsilon$ and $R^\zeta$ are identical to or different from one another and each is hydrogen, hydroxyl, halogen, eg. chlorine or bromine, alkyl, for example of from 1 to 4 carbon atoms, preferably methyl or tert.-butyl, acyloxy, eg. acetyl or propionyloxy, or alkoxy, for example of from 1 to 4 carbon atoms, preferably methoxy or tert.-butoxy, and $X^\ominus$ is $AsF_6^\ominus$, $SbF_6^\ominus$, $PF_6^\ominus$, $BF_4^\ominus$, $ClO_4^\ominus$, $CH_3SO_3^\ominus$ or $CF_3SO_3^\ominus$.

Examples of particularly suitable components (b) are triphenylsulfonium salts, diphenyliodonium salts, the tris(4-hydroxyphenyl)sulfonium salt and the tris(4-ethyloxycarbonyloxyphenyl)sulfonium salt, each with $X^\ominus = ClO_4^\ominus$, $AsF_6^\ominus$, $PF_6^\ominus$, $SbF_6^\ominus$, $BF_4^\ominus$, $CH_3SO_3^\ominus$ and/or $CF_3SO_3^\ominus$ as counterions.

It is also possible to use mixtures of the compounds mentioned under (b). Component (b) is in general present in the radiation-sensitive mixture according to the present invention in amounts of from 1 to 20, preferably from 3 to 10, % by weight, based on the total amount of the radiation-sensitive mixture (a)+(b).

The radiation-sensitive mixture according to the present invention may additionally contain customary assistants and additives.

The mixtures according to the present invention are preferably dissolved in an organic solvent, the solids content of the solution ranging in general from 5 to 40% by weight. The solvents are preferably aliphatic ketones, ethers and esters and also mixtures thereof. Particular preference is given to alkylene glycol monoalkyl ethers, eg. ethylcellosolve, butylglycol, methylcellosolve and 1-methoxy-2-propanol, alkylene glycol alkyl ether esters, eg. methylcellosolve acetate, ethylcellosolve acetate, methylpropylene glycol acetate and ethylpropylene glycol acetate, ketones, eg. cyclohexanone, cyclopentanone and methyl ethyl ketone, and also acetates such as butylacetate and aromatics, such as toluene and xylene. The choice of solvent or solvent mixture depends on the particular choice of phenolic monomer, novolak and photosensitive component.

It is also possible to include other additives such as adhesion promoters, wetting agents, dyes and plasticizers, in general in amounts of up to 1% by weight.

If desired, it is also possible to add sensitizers in small amounts to sensitize the compounds in the region extending from long wavelength UV to visible light. Polycyclic aromatics, such as pyrene and perylene, are preferred for this purpose, but it is also possible to use other dyes which act as sensitizers.

In the process for producing relief patterns according to the present invention, a radiation-sensitive recording layer which consists essentially of the radiation-sensitive mixture according to the present invention is subjected to imagewise exposure at such an energy level that the solubility of the exposed areas in aqueous alkali increases and these irradiated areas can be selectively removed with the alkaline developer.

A particular advantage of the radiation-sensitive mixtures according to the present invention is that they produce very good structure properties (very steep edges, clean structures).

The photoresist solutions containing the radiation-sensitive mixture according to the present invention are in general applied to suitable substrates, for example surface-oxidized silicon wafers, in a layer thickness of from 0.1 to 5 $\mu$m, preferably from 0.5 to 1.5 $\mu$m, by spin coating, dried (for example at from 70 to 130° C.) and subjected to imagewise irradiation through a photomask with a suitable light source. Suitable light sources are in particular short-wave (deep) UV, ranging in wavelength from 200 to 300 nm. Particularly suitable light sources are excimer lasers of KrF (248 nm). Following imagewise irradiation, with or without a short postbake at up to 150° C., the layer is developed with customary aqueous alkali, in general at pH 12–14, and the iirradiated areas are washed out. The resolution is in the submicron range. The irradiation energy required for the radiation-sensitive mixtures according to the present invention is in general within the range from 50 to 300 mJ/cm$^2$ in the case of layers 1 $\mu$m in thickness.

In the Examples, parts and percentages are by weight, unless otherwise stated.

The phenolic resins (a) whose phenolic hydroxyl groups have partly been replaced for group (I) can be prepared similarly to the method described in Helv. Chim. Acta 46 (1963), 415.

Example of the preparation of a poly(p-hydroxystyrene) whose phenolic hydroxyl groups are partly protected by 2-tetrahydropyranyl groups:

10 parts of a poly(p-hydroxystyrene) (molecular weight= 10,000) and 4 parts of 3,4-dihydropyran are dissolved in 90 parts of ethyl acetate; 0.15 part of concentrated HCl (36% strength solution) is added under $N_2$, and the mixture is stirred at room temperature until the IR spectrum of the solution is identical to that of the solution of the mixture of poly(p-hydroxystyrene) and 2-tetrahydropyranyl 4-ethylphenyl ether (ratio 1:1); that is, 50% of the phenolic base groups are protected by tetrahydropyranyl groups. The resulting product is precipitated in 1,500 parts of naphtha, filtered off with suction and dried at 50° C. under reduced pressure. The IR spectrum of the product after drying shows that about 50% of the OH groups are protected by tetrahydropyranyl groups.

EXAMPLE 1

A photoresist solution is prepared from 95 parts of a product prepared as described above from a poly(p-hydroxystyrene) having an average molecular weight $\overline{M}_w$ of 10,000 whose phenolic hydroxyl groups are 50% protected by 2-tetrahydropyranyl groups, 5 parts of triphenylsulfonium hexafluoroarsenate and 250 parts of ethylene glycol monomethyl ether acetate.

The solution is then filtered through a filter having a pore diameter of 0.2 $\mu$m.

The resist solution is applied to a silicon wafer coated with hexamethyldisilazane as adhesion promoter by spin coating at 4000 rpm for 30 seconds, which produces a layer about 1 $\mu$m in thickness. The wafer is dried on a hot plate at 80° C. for 3 minutes and then brought into contact with an image-bearing test mask and irradiated with an excimer laser ($\lambda$=248 nm, E=35 mW/cm$^2$). Thereafter the wafer is baked at 80° C. for 1 minute and developed with a developer of pH 12.0–13.6. The light sensitivity is 80 mJ/cm$^2$.

There is no noticeable dark depletion (=loss of layer thickness in the unexposed areas in the course of development).

COMPARATIVE EXAMPLE 1

Example 1 is repeated, except that the 95 parts of poly (p-hydroxystyrene) whose phenolic hydroxyl groups are 50% protected by 2-tetrahydropyranyl groups are replaced by 95 parts of a poly(p-hydroxystyrene) only 15% of whose phenolic hydroxyl groups are protected by 2-tetrahydropyranyl groups. The light sensitivity is in this case 65 mJ/cm$^2$, but the dark depletion is about 20%, which is no longer acceptable.

COMPARATIVE EXAMPLE 2

Example 1 is repeated, except that the 95 parts of poly (p-hydroxystyrene) whose phenolic hydroxyl groups are 50% protected by 2-tetrahydropyranyl groups are replaced by 95 parts of a poly(p-hydroxystyrene) 80% of whose phenolic hydroxyl groups are protected by 2-tetrahydropyranyl groups. The resulting resist proves to be positive-working at a light sensitivity of 100 mJ/cm$^2$ but negative-working, ie. tending to leave a thick residual layer, at a light sensitivity of 150 mJ/cm$^2$.

EXAMPLE 2

Example 1 is repeated, except that the 5 parts of triphenylsulfonium hexafluoroarsenate are replaced by 5 parts of diphenyliodonium hexafluorophosphate. The light sensitivity is 270 mJ/cm$^2$.

EXAMPLE 3

Example 1 is repeated, except that the 5 parts of triphenylsulfonium hexafluoroarsenate are replaced by 5 parts of tris(4-hydroxyphenyl)sulfonium triflate. The light sensitivity is 90 mJ/cm$^2$.

EXAMPLE 4

Example 3 is repeated, except that no postbake at 80° C. is employed. The light sensitivity is 130 mJ/cm$^2$.

EXAMPLE 5

Example 3 is repeated, except that the postbake takes place not at 80° C. but at 120° C. The light sensitivity is 60 mJ/cm$^2$.

EXAMPLE 6

Example 3 is repeated, except that the 95 parts of poly (p-hydroxystyrene) whose phenolic hydroxyl groups are 50% protected by 2-tetrahydropyranyl groups are replaced by 97 parts thereof and the 5 parts of tris(4-hydroxyphenyl)sulfonium triflate are replaced by 3 parts thereof. The light sensitivity is 100 mJ/cm².

We claim:

1. A positive-working radiation-sensitive mixture consisting essentially of
   (a) a water-insoluble but alkali-soluble binder or binder mixture,
   (b) a compound which forms a strong acid on irradiation,
   (c) optionally up to 1% by weight of an additive selected from the group consisting of an adhesion promoter, a surfactant and a dye, based on the total amount of (a)+(b)+additive, and
   (d) optionally a sensitizer which absorbs UV-radiation and transfers it to component (b),
wherein component (a) is a phenolic resin whose phenolic hydroxyl groups have been replaced to an extent of from 30 to 70% by

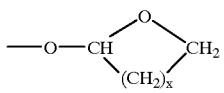

wherein x is 2 or 3,
wherein component (b) is a sulfonium salt of the formula (V)

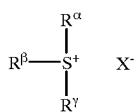

(V)

and $R^\alpha$, $R^\beta$ and $R^\gamma$ are identical or different and each is alkyl of from 1 to 3 carbon atoms, phenyl, halogen-substituted phenyl, $C_1$–$C_4$-alkyl-substituted phenyl, or 4-hydroxy-substituted phenyl, $X^-$ is $ClO_4^-$, $AsF_6^-$, $SbF_6^-$, $PF_6^-$, $BF_4^-$, or $CF_3SO_3^-$.

2. The positive-working radiation-sensitive mixture of claim 1 wherein component (a) is a phenolic resin whose phenolic hydroxyl groups have been replaced to an extent of about 50% by 2-tetrahydropyranyl groups.

3. The positive working radiation-sensitive mixture of claim 2, wherein the phenolic resin is a poly-p-hydroxystyrene.

4. The positive-working radiation sensitive mixture of claim 1, wherein component (b) of the radiation-sensitive mixture is a tris(4-hydroxyphenyl)sulfonium salt.

5. The positive-working radiation-sensitive mixture of claim 1, wherein at least one of $R^\alpha$, $R^\beta$ and $R^\gamma$ is

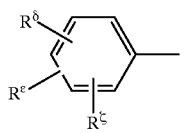

where $R^\delta$, $R^\epsilon$ and $R^\zeta$ are identical or different and each is hydroxyl, halogen, alkyl from 1 to 4 carbon atoms or hydrogen, wherein at least one of $R^\delta$, $R^\epsilon$ and $R^\zeta$ is hydroxyl.

6. The positive-working radiation-sensitive mixture of claim 1, wherein the radiation-sensitive mixture contains up to 1% by weight of an additive selected from the group consisting of an adhesion promoter, a surfactant, and a dye, based on the total amount of (a)+(b)+additive.

7. The positive-working radiation-sensitive mixture of claim 1, wherein component (a) of the radiation-sensitive mixture is present in an amount of from 80 to 99% by weight and component (b) of the radiation-sensitive mixture is present in an amount of from 1 to 20% by weight, based on the total amount of (a)+(b).

8. The positive-working radiation-sensitive mixture of claim 1, further containing a sensitizer which absorbs UV-radiation and transfers it to component (b).

9. A process for producing a positive relief structure comprising
   applying a radiation-sensitive mixture in a thickness of from 0.1 to 5 μm to a substrate,
   drying the radiation-sensitive mixture at 70–130° C. to form a layer,
   imagewise exposing the layer to UV, thereby creating exposed areas and unexposed areas of the layer,
   subsequently heating the imagewise exposed layer to 70–160° C., and
   developing the imagewise exposed and subsequently heated layer in aqueous alkali,
wherein said radiation-sensitive mixture consists essentially of:
   (a) as a binder, phenolic-resin having groups

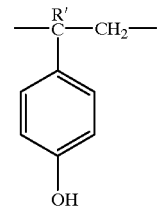

(II)

wherein R' is hydrogen or methyl,
in which the phenolic hydroxyl groups have been replaced by

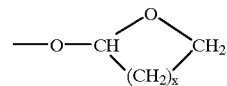

wherein x is 2 or 3, to an extent of at least 30% and not more than 70%,
   (b) as a compound which forms a strong acid on irradiation, a sulfonium salt of the formula (V)

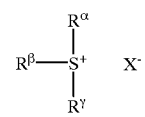

(V)

wherein
   $R^\alpha$, $R^\beta$ and $R^\gamma$ are identical or different and each is alkyl of from 1 to 3 carbon atoms, phenyl, halogen-substituted phenyl, hydroxy-substituted phenyl or $C_1$–$C_4$-alkyl-substituted phenyl, or 4-hydroxy-substituted phenyl,
   $X^-$ is $ClO_4^-$, $AsF_6^-$, $SbF_6^-$, $PF_6^-$, $BF_4^-$ or $CF_3SO_3^-$;
   (c) optionally up to 1% by weight of an additive selected from the group consisting of an adhesion promoter, a surfactant and a dye, based on the total amount of (a)+(b)+additive, and (d) optionally a sensitizer which absorbs UV-radiation and transfers it to component (b).

10. The process of claim 9, wherein component (a) of the radiation-sensitive mixture is a phenolic resin whose phenolic hydroxyl groups have been replaced by

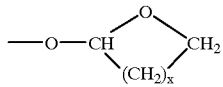

wherein x is 2 or 3, to an extent of 30 to 60%.

11. The process of claim 9, wherein component (a) of the radiation-sensitive mixture is a phenolic resin whose phenolic hydroxyl groups have been replaced to an extent of 50 to 70% by 2-tetrahydropyranyl groups.

12. The process of claim 9, wherein component (a) of the radiation-sensitive mixture is a phenolic resin whose phenolic hydroxyl groups have been replaced to an extent of 50% by 2-tetrahydropyranyl groups.

13. The process of claim 9, wherein $X^-$ is $AsF_6^-$.

14. The process of claim 9, wherein at least one of $R^\alpha$, $R^\beta$ and $R^\gamma$ is

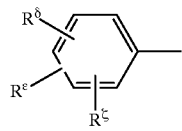

where $R^\delta$, $R^\epsilon$ and $R^\zeta$ are identical or different and each is hydroxyl, halogen, alkyl from 1 to 4 carbon atoms or hydrogen, wherein at least one of $R^\delta$, $R^\epsilon$ and $R^\zeta$ is hydroxyl.

15. The process of claim 9, wherein component (a) of the radiation-sensitive mixture is a copolymer of p-hydroxystyrene and 2-tetrahydropyranyl-oxystyrene or 2-tetrahydrofuranyl-oxystyrene.

16. The process of claim 9, wherein component (a) of the radiation-sensitive mixture is present in an amount of from 80 to 99% by weight and component (b) of the radiation sensitive mixture is present in an amount of from 1 to 20% by weight, based on the total amount of (a)+(b).

17. The process of claim 9, wherein the radiation-sensitive mixture contains a sensitizer which absorbs UV-radiation and transfers it to component (b) of the radiation-sensitive mixture.

18. The process of claim 9, wherein the radiation-sensitive mixture contains up to 1% by weight of an additive selected from the group consisting of an adhesion promoter, a surfactant, and a dye, based on the total amount of (a)+(b)+additive.

19. The process of claim 9, wherein component (b) of the radiation-sensitive mixture is a tris(4-hydroxyphenyl) sulfonium salt.

* * * * *